United States Patent
Kim (10) Patent No.: US 7,612,591 B2
(45) Date of Patent: Nov. 3, 2009

(54) DLL CIRCUIT OF SEMICONDUCTOR MEMORY APPARATUS AND METHOD OF DELAYING AND LOCKING CLOCK IN SEMICONDUCTOR MEMORY APPARATUS

(75) Inventor: Kyoung Nam Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/185,835

(22) Filed: Aug. 5, 2008

(65) Prior Publication Data
US 2008/0290918 A1 Nov. 27, 2008

Related U.S. Application Data

(63) Continuation of application No. 11/643,916, filed on Dec. 22, 2006, now Pat. No. 7,414,446.

(30) Foreign Application Priority Data
Mar. 7, 2006 (KR) ...................... 10-2006-0021233

(51) Int. Cl.
  *H03L 7/06* (2006.01)
(52) U.S. Cl. .................. 327/158; 327/149; 327/156
(58) Field of Classification Search .............. 327/147, 327/149, 156, 158, 161
See application file for complete search history.

(56) References Cited

U.S. PATENT DOCUMENTS

| | | | | |
|---|---|---|---|---|
| 5,973,525 | A * | 10/1999 | Fujii | 327/158 |
| 6,066,969 | A * | 5/2000 | Kawasaki et al. | 327/156 |
| 6,069,506 | A * | 5/2000 | Miller et al. | 327/156 |
| 6,181,174 | B1 * | 1/2001 | Fujieda et al. | 327/158 |
| 6,242,954 | B1 * | 6/2001 | Taniguchi et al. | 327/149 |
| 6,828,835 | B2 * | 12/2004 | Cho | 327/158 |
| 6,867,627 | B1 | 3/2005 | Murtagh | |
| 6,928,128 | B1 | 8/2005 | Sidiropoulos | |
| 6,940,325 | B2 * | 9/2005 | Lee | 327/158 |
| 6,954,094 | B2 | 10/2005 | Lee et al. | |
| 6,980,479 | B2 | 12/2005 | Park | |
| 6,989,700 | B2 * | 1/2006 | Kim | 327/158 |
| 7,027,336 | B2 * | 4/2006 | Lee | 365/194 |
| 7,039,147 | B2 | 5/2006 | Donnelly et al. | |

(Continued)

FOREIGN PATENT DOCUMENTS

JP  2005-323323  11/2005

*Primary Examiner*—Lincoln Donovan
*Assistant Examiner*—Adam D Houston
(74) *Attorney, Agent, or Firm*—Venable LLP; Jeffri A. Kaminski (57) ABSTRACT

A DLL circuit of a semiconductor memory apparatus includes a frequency sensing unit that generates and outputs a high frequency signal and a low frequency signal on the basis of a CAS latency signal. A clock dividing unit divides the frequency of an internal clock by a predetermined value and generates a divided clock in response with whether the high frequency signal is enabled or the low frequency signal is enabled. A phase sensing unit that switches a reference clock and a comparison clock, compares the phases thereof in accordance with whether the high frequency signal is enabled or the low frequency signal is enabled, selectively switches first and second phase control signals generated on the basis of the comparison result, and outputs the switched signals.

16 Claims, 6 Drawing Sheets

U.S. PATENT DOCUMENTS

| | | | |
|---|---|---|---|
| 7,158,443 B2 * | 1/2007 | Lin | 365/189.07 |
| 7,215,165 B2 * | 5/2007 | Yamamoto et al. | 327/156 |
| 7,259,604 B2 * | 8/2007 | Gomm | 327/175 |
| 7,298,189 B2 * | 11/2007 | Kang et al. | 327/158 |
| 7,323,915 B2 * | 1/2008 | Josephson | 327/149 |
| 7,545,187 B2 * | 6/2009 | Iwaida et al. | 327/156 |
| 2004/0212406 A1 | 10/2004 | Jung | |
| 2004/0212413 A1 * | 10/2004 | Lee | 327/158 |
| 2005/0093594 A1 * | 5/2005 | Kim et al. | 327/158 |
| 2005/0248997 A1 * | 11/2005 | Lee | 365/194 |
| 2006/0274597 A1 * | 12/2006 | Lin | 365/233 |
| 2007/0285138 A1 * | 12/2007 | Bhowmik et al. | 327/158 |
| 2009/0091363 A1 * | 4/2009 | Kang et al. | 327/158 |

\* cited by examiner

Fig. 1

PRIOR ART

FIG. 2

(PRIOR ART)

DLL CIRCUIT OF SEMICONDUCTOR MEMORY APPARATUS AND METHOD OF DELAYING AND LOCKING CLOCK IN SEMICONDUCTOR MEMORY APPARATUS

This application is a continuation of U.S. patent application Ser. No. 11/643,916, filed Dec. 22, 2006, the subject matter of which application is incorporated herein by reference in its entirety.

BACKGROUND OF THE INVENTION

1. Technical Field

The present invention relates to a DLL circuit of a semiconductor memory apparatus and a method of delaying and locking a clock in a semiconductor memory apparatus, in particular, a DLL circuit of a semiconductor memory apparatus and a method of delaying and locking a clock in a semiconductor memory apparatus, which can be utilized regardless of the frequency of a clock.

2. Related Art

Generally, a DLL circuit is used to supply an internal clock having a phase earlier than that of a reference clock by converting an external clock by a predetermined time. The internal clock is generated so it operates in synchronization with the external clock in a semiconductor memory apparatus having high integration, such as synchronous DRAM (SDRAM).

In particular, when the external clock is input to a clock input buffer through an input pin, the internal clock is generated from the clock input buffer. The internal clock controls a data output buffer such that data is output to the outside. At this time, the internal clock is delayed from the external clock by a predetermined time due to a clock buffer. The output data also delayed from the internal clock by a predetermined time is output from a data output buffer.

Therefore, there is a problem in that the output data is output after being delayed for a considerable time longer than the external clock. In other words, a time at which the data is output after the external clock is applied, that is, an output data access time, becomes long.

In order to solve the above-mentioned problem, a DLL circuit should cause an internal clock to have a phase earlier than the external clock by a predetermined time, such that output data can be output without being delayed with respect to the external clock. That is, the DLL circuit receives an external clock and generates an internal clock having a phase earlier than the external clock by a predetermined time. The internal clock is used as a reference clock in a data output buffer or the like.

Hereinafter, a DLL circuit according to the related art will be described with reference to the accompanying drawings.

Figure 1:
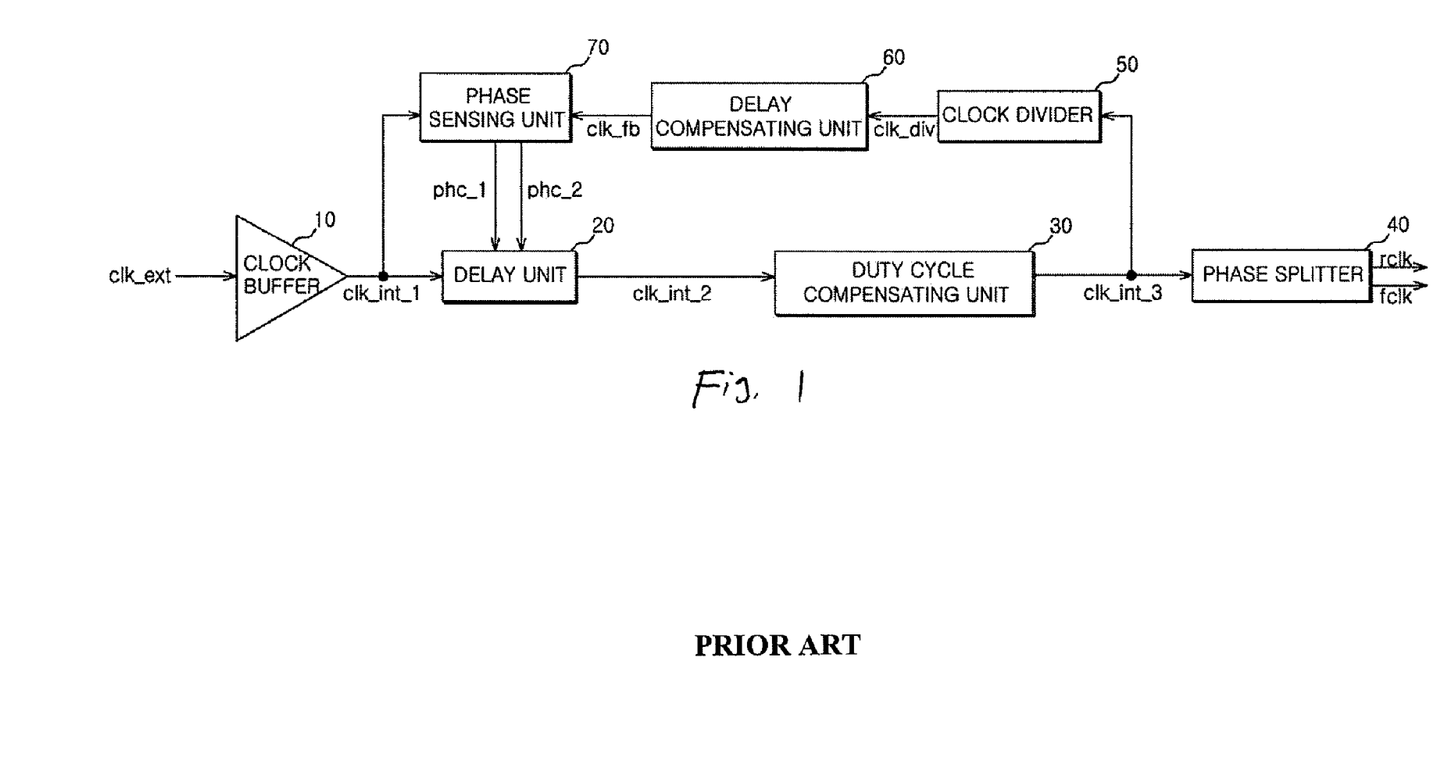
FIG. 1 is a block diagram illustrating the internal structure of a DLL circuit of a semiconductor memory apparatus according to the related art.

FIG. 1 is a block diagram showing the internal structure of a DLL circuit of a semiconductor memory apparatus according to the related art.

The DLL circuit shown in FIG. 1 includes: a clock buffer 10 that converts the amplitude of an external clock clk_ext and generates a first internal clock clk_int_1; a delay unit 20 that sets a delay time to the first internal clock clk_int_1, performs a push/pull delay with respect to the delayed first internal clock clk_int_1 in response to the inputs of first and second phase control signals phc_1 and phc_2, and then generates a second internal clock clk_int_2; a duty cycle compensation unit 30 that detects the duty cycle of the second internal clock clk_int_2 and generates a third internal clock clk_int_3 in which the duty ratio is fifty percent; a phase splitter 40 that controls the phase of the third internal clock clk_int_3 and generates and outputs a rising clock rclk and a falling clock fclk; a clock divider 50 that divides the frequency of the third internal clock clk_int_3 by a predetermined value and generates a divided clock clk_div; a delay compensation unit 60 that delays the divided clock clk_div and generates a feedback clock clk_fb so as to compensate for a delayed time set by delay elements existing on a path in which the second internal clock clk_int_2 is output to the outside of a semiconductor memory apparatus; and a phase sensing unit 70 that senses a phase difference between the first internal clock clk_int_1 and the corresponding feedback clock clk_fb, generates the first and second phase control signals phc_1 and phc_2, and transmits the generated first and second phase control signals phc_1 and phc_2 to the delay unit 20.

When the external clock clk_ext is transmitted to the clock buffer 10 from the outside of the semiconductor memory apparatus, the clock buffer 10 converts the external clock clk_ext having a small amplitude into the first internal clock clk_int_1 having a large amplitude, and transmits the first internal clock clk_int_1 to the delay unit 20. The delay unit 20 delays the first internal clock clk_int_1 by a predetermined time and outputs the first internal clock clk_int_1 as the second internal clock clk_int_2. At this time, in the second internal clock clk_int_2, a time ratio is not exactly equal between a high level cycle and a low level cycle. Therefore, the duty cycle compensation unit 30 detects the duty cycle of the second internal clock clk_int_2 and then outputs the third internal clock clk_int_3 having adjusted the duty ratio thereof.

The clock divider 50 is used for a high frequency external clock clk_ext. This is because when the external clock clk_ext has a high frequency, due to the first to third internal clocks clk_int_1 to clk_int_3 and the feedback clock clk_fb changing to high frequency clocks, the high frequency clocks may be become inactive. Further, it becomes difficult for the phase sensing unit 70 to compare the first internal clock clk_int_1 and the feedback clock clk_fb. Therefore, the clock divider 50 is used in a case when the external clock signal clk_ext has a high frequency so as to divide the frequency of the third internal clock clk_int_3 and generate the divided clock clk_div. If the clock divider 50 is set to divide the frequency of the third internal clock clk_int_3 in half, the cycle of the divided clock clk_div becomes two times larger than the cycle of the third internal clock clk_int_3.

The delay compensating unit 60 has delay values of delay elements existing on a path in which the second internal clock clk_int_2 is output from the delay unit 20 to the outside of the semiconductor memory apparatus. Accordingly, the delay compensating unit 60 sets a predetermined delay time to the divided clock clk_div to compensate the delay values of the delay elements, and generates the feedback clock clk_fb. The phase sensing unit 70 compares the phases of the first internal clock clk_int_1 and the feedback clock clk_fb and generates the first and second phase control signals phc_1 and phc_2. At this time, the first phase control signal phc_1 has a logical value inverse to that of the second phase control signal phc_2. When the first control signal phc_1 is enabled, the delay unit 20 sets a positive delay time to the first internal clock clk_int_1 and performs a push delay operation. When the second control signal phc_2 is enabled, the delay unit 20 sets a negative delay time to the first internal clock clk_int_1 and performs a pull delay operation.

Figure 2:
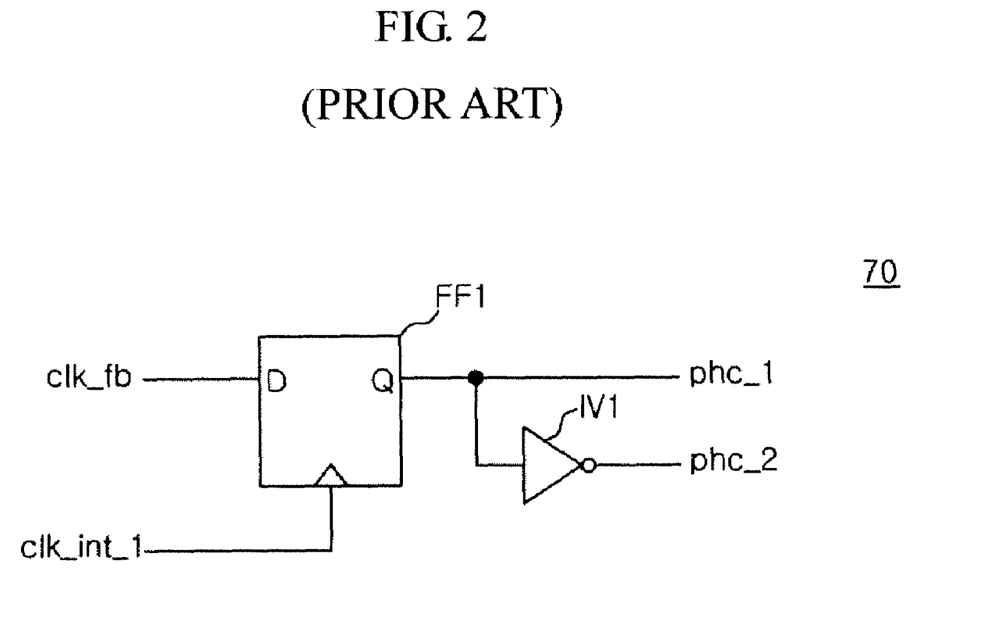
FIG. 2 is a circuit diagram illustrating the internal structure of a phase sensing unit shown in FIG. 1.

FIG. 2 is a circuit diagram showing the internal structure of the phase sensing unit shown in FIG. 1.

The phase sensing unit 70 includes: a first flip-flop FF1 that receives the feedback clock clk_fb input at a rising edge time of the first internal clock clk_int_1 and outputs the first phase control signal phc_; and a first inverter IV1 that inverts the first phase control signal phc_1 and outputs the second phase control signal phc_2.

When the feedback clock clk_fb has a phase earlier than that of the first internal clock clk_int_1, the phase of the feedback clock clk_fb is a high level at a rising edge time of the first internal clock clk_int_1. Accordingly, the first phase control signal phc_1 is enabled, that is, the first phase control signal phc_1 changes to a high level, and the second phase control signal phc_2 is disabled, that is, the second phase control signal phc_2 changes to a low level. In contrast, when the first internal clock clk_int_1 has a phase earlier than that of the feedback clock clk_fb, the phase of the feedback clock clk_fb is a low level at a rising edge time of the first internal clock clk_int_1. Accordingly, the first phase control signal phc_1 is disabled, that is, the first phase control signal phc_1 changes to a low level and the second phase control signal phc_2 is enabled, that is, the second phase control signal phc_2 changes to a high level. That is, the phase sensing unit 70 compares the phases of the feedback clock clk_fb on the basis of the first internal clock clk_int_1 as a reference clock so as to control the operation of the delay unit 20.

Figure 3A:
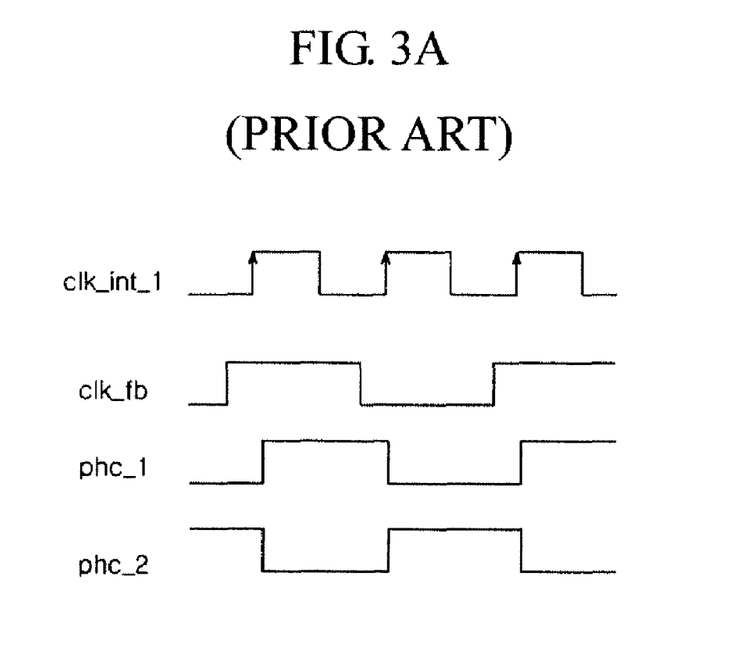
FIGS. 3A and 3B are graphs explaining the operation of the DLL circuit of a semiconductor memory apparatus according to the related art.
Figure 3B:
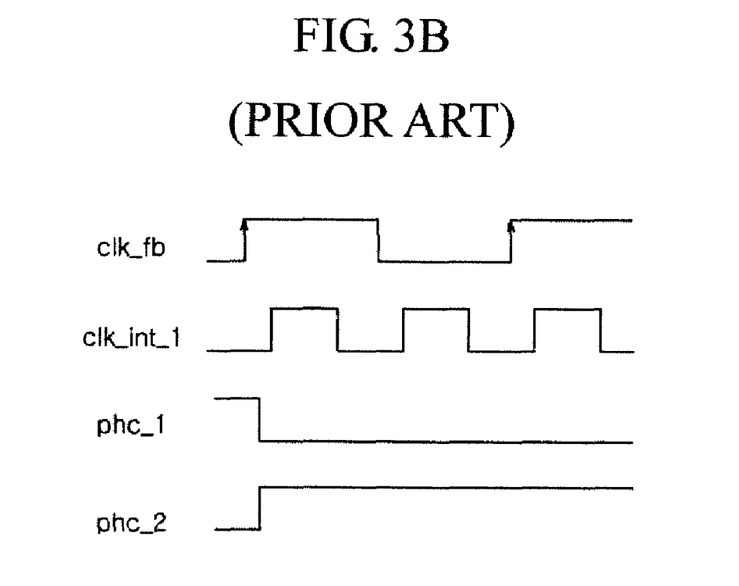

FIGS. 3A and 3B are graphs for explaining the operation of the DLL circuit of a semiconductor memory apparatus according to the related art.

As shown in FIG. 3A, the feedback clock clk_fb is a clock signal having a cycle two times larger than that of the first internal clock clk_int_1. In this case, since the feedback clock clk_fb has a phase earlier than that of the first internal clock clk_int_1, the first phase control signal phc_1 should be enabled. However, when the phase of the feedback clock clk_fb is determined at a rising edge time of the first internal clock clk_int_1 and the first and second phase control signals phc_1 and phc_2 are generated, the first phase control signal phc_1 becomes a pulse signal having a phase at a high level and second phase control signal phc_2 becomes a pulse signal having a phase at a low level. Therefore, the delay unit 20 which receives the first and second phase control signals phc_1 and phc_2 and delays the first internal clock clk_int_1 repeatedly performs the push delay operation and the pull delay operation. As a result, it causes a problem in that the phase of the first internal clock clk_int_1 is not consistent with the phase of the feedback clock clk_fb.

FIG. 3B shows the operation of the DLL circuit in which the described problems are solved. FIG. 3B shows the operation of the DLL circuit in which the first internal clock clk_int_1 is input to the phase sensing unit 70, instead of the feedback clock clk_fb, and the feedback clock clk_fb is input to the phase sensing unit 70, instead of the first internal clock clk_int_1. That is, the phase of the first internal clock clk_int_1 is compared on the basis of the feedback clock clk_fb so as to generate the first and second phase control signals phc_1 and phc_2. In this case, the first and second phase control signals phc_1 and phc_2 are generated at a predetermined level. However, the first and second phase control signals phc_1 and phc_2 have inverse phases with respect to the case based on the first internal clock clk_int_1. Therefore, the first and second phase control signals phc_1 and phc_2 should be switched with each other and then input to the delay unit.

As described above, if the phase of the first internal clock clk_int_1 is compared on the basis of the feedback clock clk_fb, a problem in that the feedback clock clk_fb is divided can be solved. However, the phases of the first and second phase control signals phc_1 and phc_2 should be changed every two cycles of the first internal clock clk_int_1. As such, no problems occur in the case when the external clock clk_ext is a high frequency signal. However, when the external clock clk_ext is a low frequency signal, since the feedback clock clk_fb and the first internal clock clk_int_1 have a large cycle, a cycle in which the first and second phase control signals phc_1 and phc_2 are changed is large. Accordingly, an internal clock generation operation with respect to the cycle change of the external clock clk_ext is late, thereby causing problems in the performance of the DLL circuit.

As described above, if a feedback clock is generated in a DLL circuit that generates internal clocks on the basis of high frequency external clocks without using a clock divider, the feedback clock may be become inactive. However, if the feedback clock is generated by using the clock divider, there is a problem in that a reference clock and the feedback clock should be switched with each other and then input to a phase sensing unit, and a cycle in which a phase control signal for setting a delay time to a delay unit is set to a new phase. In order to solve the above-described problems, a clock divider is arbitrarily selected by a switch such as a fuse on the basis of the frequency of an external clock in the related art. Therefore, there are problems in that the clock divider should be selectively used on the basis of the frequency of the external clock and the connection of the input/output terminal of the phase sensing unit should be changed. Accordingly, the cost and time necessary for developing and utilizing the DLL circuit are inefficiently managed.

SUMMARY

Embodiments of the present invention provide a DLL circuit of a semiconductor memory apparatus and a method of delaying and locking a clock in a semiconductor memory apparatus, which can efficiently perform a phase fixing operation of an internal clock of the semiconductor memory apparatus by selectively dividing phases of the internal clock and switching a reference clock and a phase control signal with respect to the frequency of an external clock.

An embodiment of the present invention provides a DLL circuit of a semiconductor memory apparatus, which includes: a frequency sensing unit configured to generate and output a high frequency signal or a low frequency signal on the basis of a CAS latency signal; a clock dividing unit configured to receive an internal clock having a frequency and to divide the frequency of the internal clock having a phase by a predetermined value and generate a divided clock in response to whether the high frequency signal is enabled or the low frequency signal is enabled; and a phase sensing unit configured to switch a reference clock and a comparison clock each having a phase, compare the phases thereof in response to whether the high frequency signal is enabled or the low frequency signal is enabled, selectively switch a first phase control signal and a second phase control signal generated on the basis of the comparison result, and output the switched signals.

Another embodiment of the present invention provides a DLL circuit of a semiconductor memory apparatus, which includes: a frequency sensing unit configured to generate and output a high frequency signal and a low frequency signal on the basis of an external clock; a clock dividing unit configured to receive an internal clock having a frequency and to divide the frequency of the internal clock having a phase by a predetermined value and generate a divided clock in response to whether the high frequency signal is enabled or the low frequency signal is enabled; and a phase sensing unit configured to switch a reference clock and a comparison clock each having a phase, compare the phases thereof in response to whether the high frequency signal is enabled or the low frequency signal is enabled, selectively switch first and second phase control signals generated on the basis of the comparison result, and output the switched signals.

The embodiment of the present invention provides a method of delaying and locking a clock in a semiconductor memory apparatus, which includes: generating and outputting a first delaying control signal as a first phase control signal and a second delaying control signal as a second phase control signal, when the length of a CAS latency is shorter than a predetermined value; wherein generating the first delay control signal and the second delaying control signal include: delaying an internal clock by a predetermined time, to generate a feedback clock, and detecting a phase difference between a reference clock and the feedback clock, wherein the first delay control signal is configured to indicate a pull delay operation to a delay unit generating the internal clock and the second delay control signal is configured to indicate a push delay operation to the delay unit, and generating and outputting the first delaying control signal as the second phase control signal and the second delaying control signal as the first phase control signal, when the length of a CAS latency is higher than a predetermined value; wherein generating the first delay control signal and the second delaying control signal include: dividing the internal clock by a predetermined ratio, to generate a divided clock, delaying the divided clock by a predetermined time, to generate a feedback clock, and detecting a phase difference between the reference clock and the feedback clock.

Another embodiment of the present invention provides a method of delaying and locking a clock in a semiconductor memory apparatus, which includes: generating and outputting a first delaying control signal as a first phase control signal and a second delaying control signal as a second phase control signal, when the frequency of an external clock is lower than a predetermined value; wherein generating the first delay control signal and the second delaying control signal include delaying an internal clock by a predetermined time, to generate a feedback clock, and detecting a phase difference between a reference clock and the feedback clock, wherein the first delay control signal is configured to indicate a pull delay operation to a delay unit generating the internal clock and the second delay control signal is configured to indicate a push delay operation to the delay unit, and generating and outputting the first delaying control signal as the second phase control signal and the second delaying control signal as the first phase control signal, when the frequency of the external clock higher than a predetermined value: wherein generating the first delay control signal and the second delaying control signal include dividing the internal clock by a predetermined ratio, to generate a divided clock, delaying the divided clock by a predetermined time, to generate a feedback clock, and detecting a phase difference between the reference clock and the feedback clock.

DESCRIPTION OF EXEMPLARY EMBODIMENT

Hereinafter, preferred embodiments of the present invention will be described below in detail with reference to the accompanying drawings.

Figure 4:
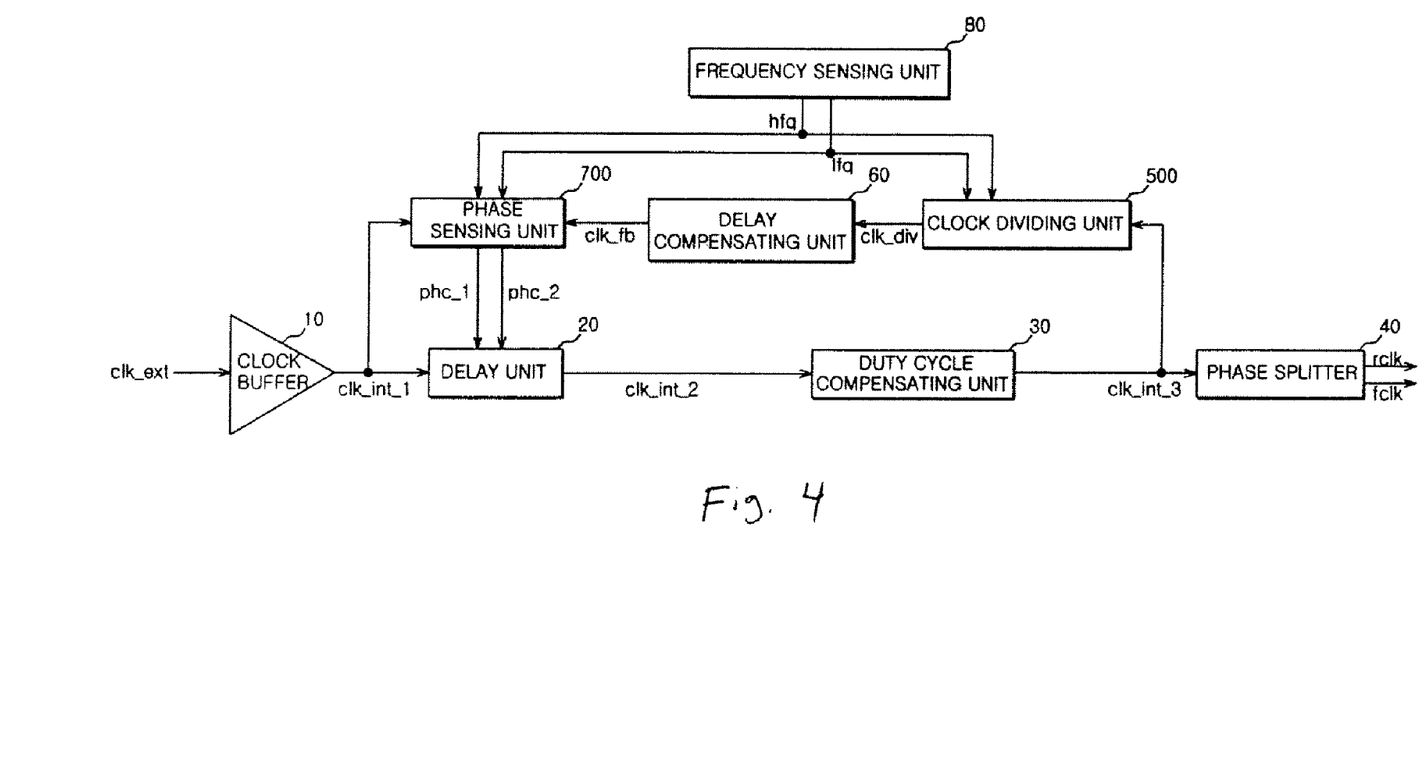
FIG. 4 is a block diagram illustrating the internal structure of a DLL circuit of a semiconductor memory apparatus according to an embodiment of the present invention.

FIG. 4 is a block diagram illustrating the internal structure of a DLL circuit of a semiconductor memory apparatus according to an embodiment of the present invention.

Referring to FIG. 4, The DLL circuit of the present embodiment includes a clock buffer 10, a delay unit 20, a duty cycle compensation unit 30, a phase splitter 40, a frequency sensing unit 80, a clock dividing unit 500, a delay compensation unit 60, and a phase sensing unit 700.

The clock buffer 10 converts the amplitude of an external clock clk_ext and generates a first internal clock clk_int_1.

The delay unit 20 sets a delay time to the first internal clock clk_int_1, performs a push/pull delay with respect to the delayed first internal clock clk_int_1 responding to first and second phase control signals phc_1 and phc_2, and generates a second internal clock clk_int_2.

The duty cycle compensation unit 30 detects a duty cycle of the second internal clock clk_int_2 and generates a third internal clock clk_int_3 having a duty ratio of fifty percent.

The phase splitter 40 controls the phase of the third internal clock clk_int_3 and generates and outputs a rising clock rclk and a falling clock fclk.

The frequency sensing unit 80 generates and outputs a high frequency signal hfq or a low frequency signal lfq on the basis of a CAS latency signal.

The clock dividing unit 500 divides the frequency of the third internal clock clk_int_3 by a predetermined value and generates a divided clock clk_div in response to whether the high frequency signal hfq is enabled or the low frequency signal lfq is enabled.

The delay compensation unit 60 delays the divided clock clk_div and generates a feedback clock clk_fb so as to compensate for a delayed time set by delay elements existing on a path in which the second internal clock clk_int_2 is output to the outside of a semiconductor memory apparatus.

The phase sensing unit 700 switches the first internal clock clk_int_1 and the feedback clock clk_fb so as to compare phases therebetween in response to whether the high frequency signal hfq is enabled or the low frequency signal lfq is enabled. Also, the phase sensing unit 700 selectively switches the first and second phase control signals phc_1 and phc_2, and transmits the first and second phase control signals phc_1 and phc_to the delay unit 20.

When the external clock clk_ext is transmitted to the clock buffer 10 from the outside of the semiconductor memory apparatus, the clock buffer 10 converts the external clock clk_ext having a small amplitude into the first internal clock clk_int_1 having a large amplitude, and transmits the first internal clock clk_int_1 to the delay unit 20. The delay unit 20 delays the first internal clock clk_int_1 by a predetermined time and outputs the first internal clock clk_int_1 as the second internal clock clk_int_2. At this time, in the second internal clock clk_2, the time ratio is not exactly equal between a high level cycle and a low level cycle. Therefore, the duty cycle compensation unit 30 detects the duty cycle of the second internal clock clk_int_2 and outputs the third internal clock clk_int_3 in which the duty ratio thereof is fifty percent.

It can be determined whether the external clock clk_ext is a high frequency clock or a low frequency clock, on the basis of a predetermined frequency, by using the length of the CAS latency set in the semiconductor memory apparatus. Accordingly, the frequency sensing unit 80 selectively enables and outputs the high frequency signal hfq or the low frequency signal lfq according to the length of the CAS latency. It can be understood that another signal other than the CAS latency signal may be used to determine whether or not the frequency of the external clock exceeds the predetermined frequency.

Thereafter, when the low frequency signal lfq is enabled, the clock dividing unit 500 does not divide the frequency of the third internal clock clk_int_3 and outputs the third internal clock clk_int_3 as the divided clock clk_div. However, when the high frequency signal hfq is enabled, the clock dividing unit 500 divides the frequency of the third internal clock clk_int_3 by a predetermined ratio so as to generate the divided clock clk_div. If the clock dividing unit 500 is set to divide the frequency of the third internal clock clk_int_3 into half, the cycle of the divided clock clk_div becomes two times larger than the cycle of the third internal clock clk_int_3.

The delay compensating unit 60 has delay values equal to the delay elements existing on a path in which the second internal clock clk_int_2 is output from the delay unit 20 to the outside of the semiconductor memory apparatus. Accordingly, the delay compensating unit 60 sets a predetermined delay time to compensate for the delay values of the delay elements to the divided clock clk_div, so as to generate the feedback clock clk_fb.

The phase sensing unit 700 compares the phases of the first internal clock clk_int_1 and the feedback clock clk_fb, and generates the first and second phase control signals phc_1 and phc_2. When the high frequency signal hfq is enabled, the phase sensing unit 700 compares the phases of the feedback signal clk_fb on the basis of the first internal clock signal clk_int_1. When the low frequency signal lfq is enabled, the phase sensing unit 700 compares the phases of the first internal clock signal clk_int_1 on the basis of the feedback signal clk_fb. At this time, the first phase control signal phc_1 has a logical value inverse to that of the second phase control signal phc_2. In response to whether the high frequency signal hfq is enabled or the low frequency signal lfq is enabled, the first and second phase control signals phc_1 and phc_2 have inverse logical values. When the first phase control signal phc_1 is enabled, the delay unit 20 sets a positive delay time to the first internal clock clk_int_1 and performs a push delay operation. When the second phase control signal phc_2 is enabled, the delay unit 20 sets a negative delay time to the first internal clock clk_int_1 and performs a pull delay operation.

Figure 5:
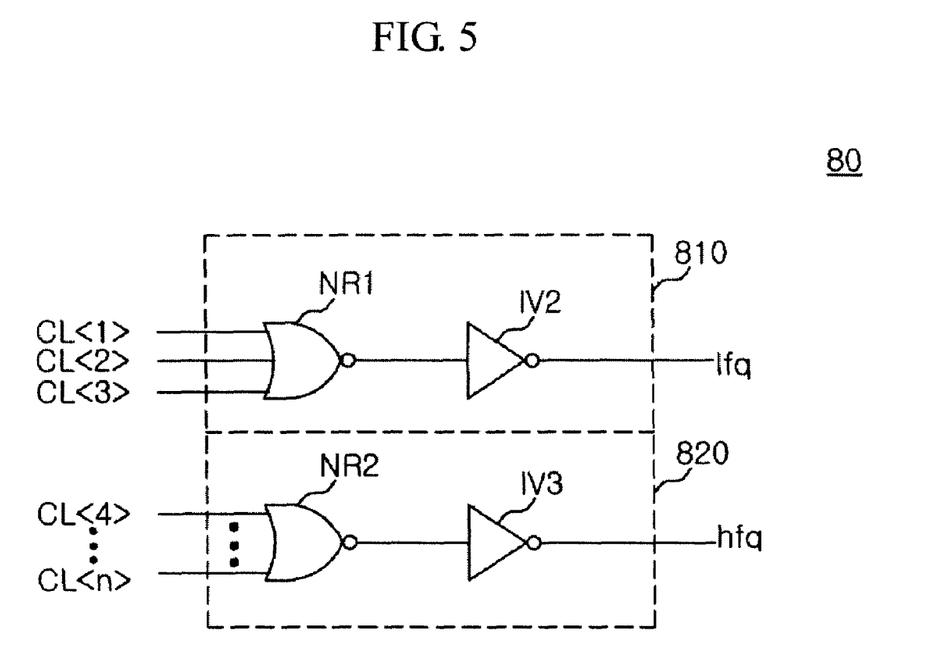
FIG. 5 is a logical diagram illustrating the internal structure of a frequency sensing unit shown in FIG. 4.

FIG. 5 shows the internal structure of the frequency sensing unit 80 shown in FIG. 4.

As shown in FIG. 5, the frequency sensing unit 80 includes: a low frequency signal generator 810 that generates the low frequency signal lfq when any one of the first to third CAS latency signals CL<1:3> is enabled; and a high frequency signal generator 820 that generates the high frequency signal hfq when any one of the fourth to n-th CAS latency signals CL<4:n> among CAS latency signals CL<1:n>) is enabled.

Here, the low frequency signal generator 810 includes: a first NOR gate NR1 which receives the first to third CAS latency signals CL<1:3>; and a second inverter IV2 which inverts an output signal of the first NOR gate NR1.

Further, the high frequency signal generator 820 includes: a second NOR gate NR2 which receives the fourth to n-th CAS latency signals CL<4:n>; and a third inverter IV3 which inverts an output signal of the second NOR gate NR2.

At this time, when the length of the CAS latency is 1 to 3, the low frequency signal lfq is enabled, and when the length of the CAS latency is 4 to n, the high frequency signal lfq is enabled. This is because it is assumed that when the length of the CAS latency is 1 to 3, the external clock clk_ext is a low frequency signal, and when the when the length of the CAS latency is 4 to n, the external clock clk_ext is a high frequency signal. However, in the DLL circuit according to an embodiment of the present invention, it has been exemplarily described for the convenience of explanation and the discrimination of high frequency from low frequency may be different from the above-described explanation.

Therefore, when the external clock clk_ext has a low frequency, any one of the first to third CAS latency signals CL<1:3> is enabled, which enables the low frequency signal lfq. Further, when the external clock clk_ext has a high frequency, any one of the fourth to n-th CAS latency signals CL<4:n> is enabled, which enables the high frequency signal hfq.

Figure 6:
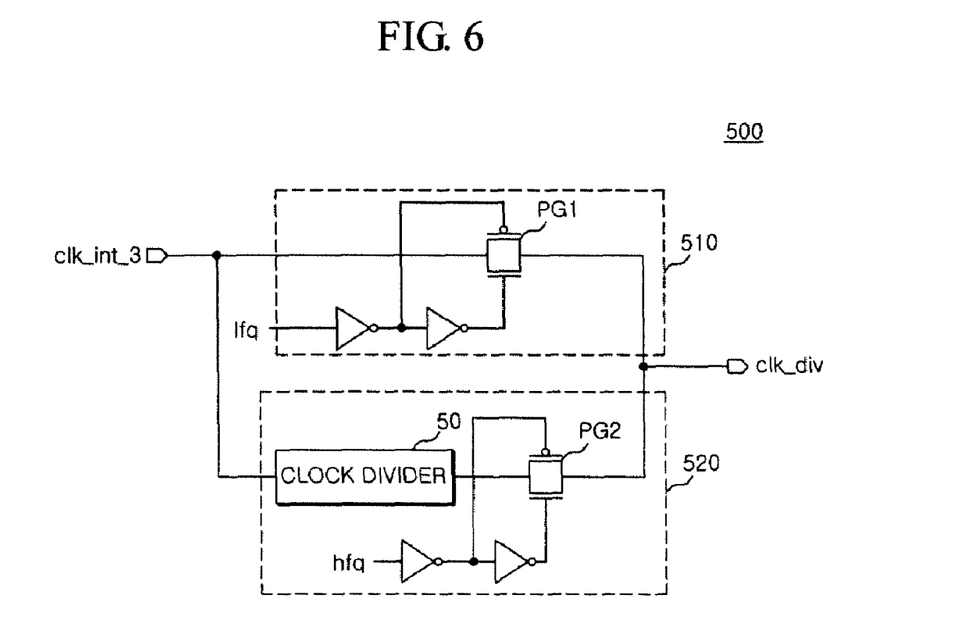
FIG. 6 is a logical diagram illustrating the internal structure of a clock divider shown in FIG. 4.

FIG. 6 shows the internal structure of the clock divider 500 shown in FIG. 4.

The clock dividing unit 500 includes a first divided clock generator 510 that outputs the divided clock clk_div when the third internal clock clk_int_3 is input and the low frequency signal lfq is enabled; and a second divided clock generator 520 that outputs the divided clock clk_div when the third internal clock clk_int_3 is input and the high frequency signal hfq is enabled.

Here, the first divided clock generator 510 has a first pass gate PG1 that outputs the third internal clock clk_int_3 as the divided clock clk_div when the low frequency signal lfq is enabled.

Further, the second divided clock generator 520 has a clock divider 50 that divides the frequency of the third internal clock clk_int_3 by a predetermined value; and a second pass gate PG2 that outputs a clock output from the clock divider 50 as the divided clock clk_div when the high frequency signal hfq is enabled.

According to the above-described structure, when the low frequency signal lfq is enabled, the first pass gate PG1 of the first divided clock generator 510 is turned on. Therefore, the third internal clock clk_int_3 functions as the divided clock clk_div. At this time, the second pass gate PG2 of the second divided clock generator 520 is turned off. Therefore, the divided clock clk_div is not affected by the clock output from the clock divider 50.

Meanwhile, when the high frequency signal hfq is enabled, the first pass gate PG1 is turned off and the second pass gate PG2 is turned on. Therefore, the clock output from the clock divider 50 functions as the divided clock clk_div.

That is, when the external clock clk_ext is a low frequency clock signal, the third internal clock clk_int_3 is not divided. Meanwhile, when the external clock clk_ext is a high frequency clock signal, the third internal clock clk_int_3 is divided by a predetermined value.

Figure 7:
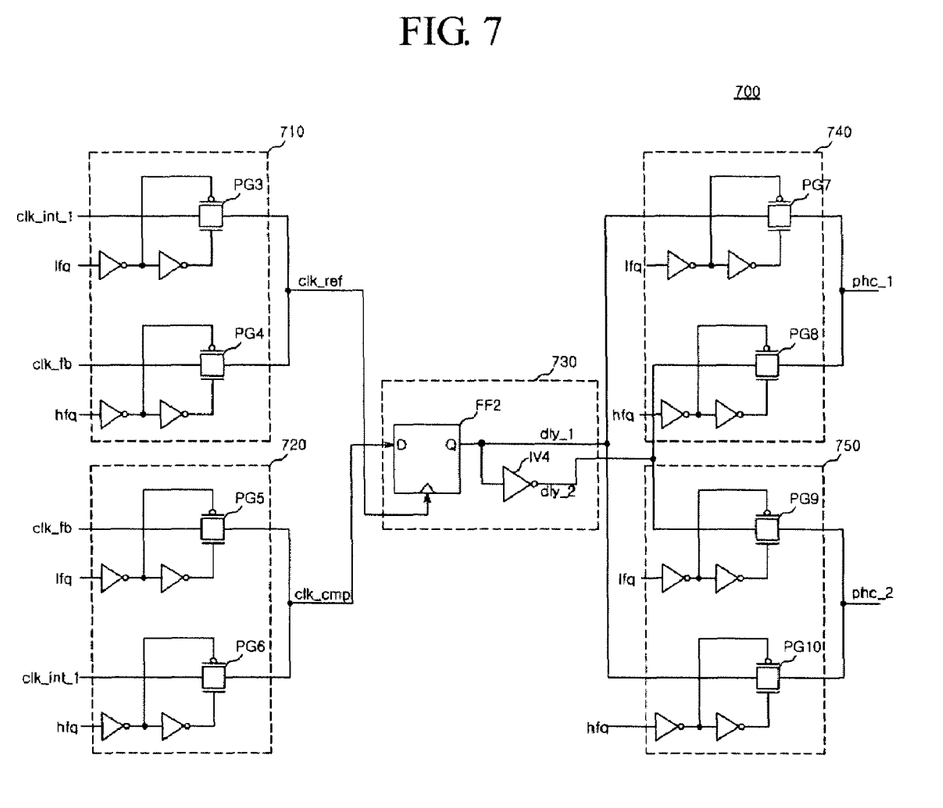
FIG. 7 is a logical diagram illustrating the internal structure of a phase sensing unit shown in FIG. 4.

FIG. 7 shows the internal structure of the phase sensing unit 700 shown in FIG. 4.

The phase sensing unit 700 shown in FIG. 7 includes: a reference clock generator 710 that generates a reference clock clk_ref on the basis of the first internal clock clk_int_1 or the feedback clock clk_fb in accordance with whether the low frequency signal lfq is enabled or the high frequency signal hfq is enabled; a comparison clock generator 720 that generates a comparison clock clk_cmp on the basis of the first internal clock clk_int_1 or the feedback clock clk_fb in accordance with whether the low frequency signal lfq is enabled or the high frequency signal hfq is enabled; a phase sensor 730 that senses a phase difference between the comparison clock clk_cmp and the reference clock clk_ref and generates and outputs a first delay signal dly_1 and a second delay signal dly_2; a first phase control signal generator 740 that generates the first phase control signal phc_1 on the basis of the first and second delay signals dly_1 and dly_2 in accordance with whether the low frequency signal lfq is enabled or the high frequency signal hfq is enabled; and a second phase control signal generator 750 that generates the second phase control signal phc_2 on the basis of the first and second delay signals dly_1 and dly_2 in accordance with whether the low frequency signal lfq is enabled or the high frequency signal hfq is enabled.

Here, the reference clock generator 710 includes a third pass gate PG3 that outputs the first internal clock clk_int_1 as the reference clock clk_ref when the low frequency signal lfq is enabled; and a fourth pass gate PG4 that outputs the feedback clock clk_fb as the reference clock clk_ref when the high frequency signal hfq is enabled.

Further, the comparison clock generator 720 includes a fifth pass gate PG5 that outputs the feedback clock clk_fb as the comparison clock clk_cmp when the low frequency signal lfq is enabled; and a sixth pass gate PG6 that outputs the first internal clock clk_int_1 as the comparison clock clk_cmp when the high frequency signal hfq is enabled.

Further, the phase sensor 730 includes: a second flip-flop FF_2 that outputs the comparison clock clk_cmp input at a rising edge time of the reference clock clk_ref as the first delay signal dly_1; and a fourth inverter IV4 that inverts the first delay signal dly_1 and outputs the delay signal dly_2.

The first phase control signal generator 740 includes: a seventh pass gate PG7 that outputs the first delay signal dly_1 as the first phase control signal phc_1 when the low frequency signal lfq is enabled; and an eighth pass gate PG8 that outputs the second delay signal dly_2 as the first phase control signal phc_1 when the high frequency signal hfq is enabled.

Finally, the second phase control signal generator 750 includes: a ninth pass gate PG9 that outputs the second delay signal dly_2 as the second phase control signal phc_2 when the low frequency signal lfq is enabled; and a tenth pass gate PG10 that outputs the first delay signal dly_1 as the second phase control signal phc_2 when the high frequency signal hfq is enabled.

When the low frequency signal lfq is enabled, the third pass gate PG3 of the reference clock generator 710 is turned on. Therefore, the first internal clock clk_int_1 functions as the reference clock clk_ref. And then, since the fifth pass gate PG5 of the comparison clock generator 720 is turned on, the feedback clock clk_fb functions as the comparison clock clk_cmp.

Thereafter, when the comparison clock clk_cmp is at a high level at a rising edge time of the reference clock clk_ref, the second flip-flop FF2 of the phase sensor 730 outputs the first delay signal dly_1 which is at a high level. When the comparison clock clk_cmp is at a low level at a rising edge time of the reference clock clk_ref, the second flip-flop FF2 of the phase sensor 730 outputs the first delay signal dly_1 which is at a low level. At this time, the second delay signal dly_2 has a phase inverse to that of the first delay signal dly_1.

Further, since the seventh pass gate PG7 of the first phase control signal generator 740 is turned on, the first delay signal dly_1 functions as the first phase control signal phc_1. Furthermore, since the ninth pass gate PG9 of the second phase control signal generator 750 is turned on, the second delay signal dly_2 functions as the second phase control signal phc_2.

That is, when the external clock clk_ext has a low frequency, the phase sensing unit 700 senses the phase difference between the first internal clock clk_int_1 and the feedback clock clk_fb and outputs the first and second phase control signals phc_1 and phc_2.

Meanwhile, when the high frequency signal hfq is enabled, the fourth pass gate PG4 of the reference clock generator 710 is turned on. Therefore, the feedback clock clk_fb functions as the reference clock clk_ref. And then, since the sixth pass gate PG6 of the comparison clock generator 720 is turned on, the first internal clock clk_int_1 functions as the comparison clock clk_cmp.

Thereafter, when the comparison clock clk_cmp is at a high level at a rising edge time of the reference clock clk_ref, the second flip-flop FF2 of the phase sensor 730 outputs the first delay signal dly_1 which is also at a high level. When the comparison clock clk_cmp is at a low level at a rising edge time of the reference clock clk_ref, the second flip-flop FF2 of the phase sensor 730 outputs the first delay signal dly_1 which is also at a low level. At this time, the second delay signal dly_2 has a phase inverse to that of the first delay signal dly_1.

Further, since the eighth pass gate PG8 of the first phase control signal generator 740 is turned on, the second delay signal dly_2 functions as the first phase control signal phc_1. Furthermore, since the tenth pass gate PG10 of the second phase control signal generator 750 is turned on, the first delay signal dly_functions as the second phase control signal phc_2.

That is, when the external clock clk_ext has a high frequency, the phase sensing unit 700 senses the phase difference between the first internal clock clk_int_1 and the feedback clock clk_fb and outputs the first and second phase control signals phc_1 and phc_2. At this time, the first phase control signal phc_1 has the same phase as that of the second delay signal dly_2 and the second phase control signal phc_2 has the same phase as that of the first delay signal dly_1.

As described above, the DLL circuit of a semiconductor memory apparatus according to the present invention does not perform a clock dividing operation with respect to a low-frequency-external-clock, but a reference clock and a feedback clock are input to a phase sensing unit and two output phase control signals are transmitted to a delay unit such that the phase of a low-frequency-internal-clock can be effortlessly locked. Further, the frequency of a high-frequency-external-clock is divided, the reference clock and the feedback clock are switched and input to the phase sensing unit, and the two phase control signals to be output are switched and transmitted to the delay unit such that the phase of a high-frequency-internal-clock can be effortlessly locked. Therefore, it is not necessary to prepare a switch such as a fuse. Further, it is not necessary to arbitrarily select and use the clock divider in accordance with the frequency of the external clock, and to switch the connection of the input/output terminal of the phase sensing unit. Accordingly, it is possible to effectively manage the cost and time for developing and utilizing the DLL circuit.

It will be apparent to those skilled in the art that various modifications and changes may be made without departing from the scope and spirit of the present invention. Therefore, it should be understood that the above embodiments are not limiting, but illustrative in all embodiments. The scope of the present invention is defined by the appended claims rather than by the description preceding them, and therefore all changes and modifications that fall within the metes and bounds of the claims, or equivalents of such metes and bounds are therefore intended to be embraced by the claims.

The above-described DLL circuit of a semiconductor memory apparatus and the method of delaying and locking a clock in a semiconductor memory apparatus according to the embodiments of the present invention can efficiently perform an operation of locking the phase of an internal clock of the semiconductor memory apparatus by selectively dividing phases of the internal clock and switching a reference clock and a phase control signal with respect to the frequency of an external clock.

What is claimed is:

1. A DLL circuit of a semiconductor memory apparatus comprising:
   a clock dividing unit configured to receive a high frequency signal, a low frequency signal, and an internal clock thereby generating a divided clock, to output the internal clock as the divided clock when the low frequency signal is enabled, and to divide the internal clock when the high frequency clock is enabled.

2. The DLL circuit of a semiconductor memory apparatus of claim 1,
   wherein the clock dividing unit includes:
   a first divided clock generator configured to receive the internal clock and output the divided clock when the low frequency signal is enabled; and
   a second divided clock generator configured to receive the internal clock and divide the internal clock when the high frequency signal is enabled.

3. The DLL circuit of a semiconductor memory apparatus of claim 1, further comprising:
   a frequency sensing unit configured to generate the high frequency signal and the low frequency signal.

4. The DLL circuit of a semiconductor memory apparatus of claim 3,
   wherein the frequency sensing unit includes:
   a low frequency signal generator configured to generate the low frequency signal when a control signal shorter than a predetermined length is enabled; and
   a high frequency signal generator configured to generate the high frequency signal when the control signal longer than the predetermined length is enabled.

5. The DLL circuit of a semiconductor memory apparatus of claim 4,
   wherein the control signal of the frequency sensing unit is a CAS latency signal.

6. The DLL circuit of a semiconductor memory apparatus of claim 4,
   wherein the control signal of the frequency sensing unit is an external signal.

7. A DLL circuit of a semiconductor memory apparatus comprising:
   a phase sensing unit configured to receive a high frequency signal, a low frequency signal, an internal clock and a feedback clock thereby outputting a first phase control signal and a second phase control signal,
   wherein the phase sensing unit is configured to compare the internal clock as a reference clock with the feedback clock as a comparing clock, thereby generating the first and second phase control signals when the high frequency signal is enabled; and to compare the feedback clock as the reference clock with the internal clock as the comparing clock thereby generating the first and second phase control signals having phases that are opposite to the phases of the first and second phase control signal when the high frequency signal is enabled.

8. The DLL circuit of a semiconductor memory apparatus of claim 7,
   wherein the phase sensing unit includes:
   a reference clock generator configured to receive a first clock and the feedback clock as input and to generate the reference clock having a phase on the basis of the first clock or the feedback clock in response to whether the low frequency signal is enabled or the high frequency signal is enabled;
   a comparison clock generator configured to receive the first clock and the feedback clock as input and to generate the comparison clock on the basis of the first clock or the feedback clock in response to whether the low frequency signal is enabled or the high frequency signal is enabled;
   a phase sensor configured to receive the reference clock and the comparison clock as input and to sense a phase difference between the reference clock and the comparison clock and to generate and output first and second delay signals;
   a first phase control signal generator configured to receive the first and second delay signals as input and to generate the first phase control signal on the basis of the first and second delay signals in response to whether the low frequency signal is enabled or the high frequency signal is enabled; and
   a second phase control signal generator configured to receive the first and second delay signals as input and to generate the second phase control signal on the basis of the first and second delay signals in response to whether the low frequency signal is enabled or the high frequency signal is enabled.

9. The DLL circuit of a semiconductor memory apparatus of claim 7, further comprising:
   a frequency sensing unit configured to generate the high frequency signal and the low frequency signal.

10. The DLL circuit of a semiconductor memory apparatus of claim 9,
    wherein the frequency sensing unit includes:
    a low frequency signal generator configured to generate the low frequency signal when a control signal shorter than a predetermined length is enabled; and
    a high frequency signal generator configured to generate the high frequency signal when the control signal longer than the predetermined length is enabled.

11. The DLL circuit of a semiconductor memory apparatus of claim 10,
    wherein the control signal of the frequency sensing unit is a CAS latency signal.

12. The DLL circuit of a semiconductor memory apparatus of claim 10,
    wherein the control signal of the frequency sensing unit is an external signal.

13. A DLL circuit of a semiconductor memory apparatus comprising:
    a frequency sensing unit configured to generate and output a high frequency signal or a low frequency signal on the basis of a control signal;
    a clock dividing unit configured to receive the high frequency signal, the low frequency signal and an internal clock thereby generating a divided clock, to output the internal clock as the divided clock when the low frequency signal is enabled, and to divide the internal clock when the high frequency clock is enabled; and
    a phase sensing unit configured to receive a high frequency signal, a low frequency signal, an internal clock and a feedback clock thereby outputting a first phase control signal and a second phase control signal, wherein the phase sensing unit is configured to compare the internal clock as a reference clock with the feedback clock as a comparing clock, thereby generating the first and second phase control signals when the high frequency signal is enabled; and to compare the feedback clock as the reference clock with the internal clock as the comparing clock thereby generating the first and second phase control signals having phases that are opposite to the phases of the first and second phase control signal when the high frequency signal is enabled.

14. The DLL circuit of a semiconductor memory apparatus of claim 13, wherein the clock dividing unit includes:

a first divided clock generator configured to receive the internal clock and output the divided clock when the low frequency signal is enabled; and a second divided clock generator configured to receive the internal clock and divide the internal clock when the high frequency signal is enabled.

15. The DLL circuit of a semiconductor memory apparatus of claim 13, wherein the frequency sensing unit includes:

a low frequency signal generator configured to generate the low frequency signal when a control signal shorter than a predetermined length is enabled; and a high frequency signal generator configured to generate the high frequency signal when the control signal longer than the predetermined length is enabled.

16. The DLL circuit of a semiconductor memory apparatus of claim 13, wherein the phase sensing unit includes:

a reference clock generator configured to receive a first clock and the feedback clock as input and to generate the reference clock having a phase on the basis of the first clock or the feedback clock in response to whether the low frequency signal is enabled or the high frequency signal is enabled;

a comparison clock generator configured to receive the first clock and the feedback clock as input and to generate the comparison clock on the basis of the first clock or the feedback clock in response to whether the low frequency signal is enabled or the high frequency signal is enabled;

a phase sensor configured to receive the reference clock and the comparison clock as input and to sense a phase difference between the reference clock and the comparison clock and to generate and output first and second delay signals;

a first phase control signal generator configured to receive the first and second delay signals as input and to generate a first phase control signal on the basis of the first and second delay signals in response to whether the low frequency signal is enabled or the high frequency signal is enabled; and a second phase control signal generator configured to receive the first and second delay signals as input and to generate a second phase control signal on the basis of the first and second delay signals in response to whether the low frequency signal is enabled or the high frequency signal is enabled.

* * * * *